Figure 1:
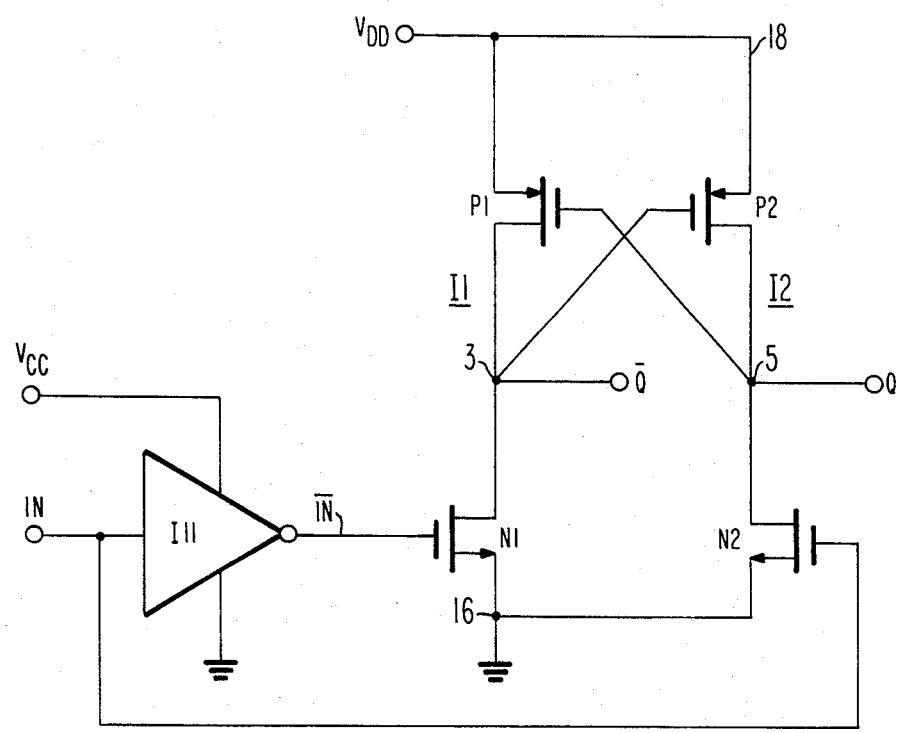

United States Patent [19]

Bismarck

[11] Patent Number: 4,532,436
[45] Date of Patent: Jul. 30, 1985

[54] FAST SWITCHING CIRCUIT

[75] Inventor: Otto H. Bismarck, Woodbridge Township, Middlesex County, N.J.

[73] Assignee: RCA Corporation, Princeton, N.J.

[21] Appl. No.: 537,817

[22] Filed: Sep. 30, 1983

[51] Int. Cl.³ .............. H03K 3/037; H03K 3/356; H03K 5/12; H03K 19/017
[52] U.S. Cl. .................. 307/279; 307/475; 307/246; 307/585; 307/263
[58] Field of Search ............ 307/451, 475, 247 R, 307/264, 279, 272 A, 268, 576, 579, 585

[56] References Cited

U.S. PATENT DOCUMENTS

| | | | |
|---|---|---|---|
| 4,039,862 | 8/1977 | Dingwall et al. | 307/475 X |
| 4,314,166 | 2/1982 | Bismarck | 307/475 |
| 4,318,015 | 3/1982 | Schade, Jr. | 307/279 X |
| 4,450,371 | 5/1984 | Bismarck | 307/475 |

FOREIGN PATENT DOCUMENTS

| | | | |
|---|---|---|---|
| 54428 | 3/1982 | Japan | 307/475 |
| 790330 | 12/1980 | U.S.S.R. | 307/475 |
| 818015 | 4/1981 | U.S.S.R. | 307/475 |

Primary Examiner—Larry N. Anagnos
Attorney, Agent, or Firm—Joseph S. Tripoli; George E. Haas; Henry I. Schanzer

[57] ABSTRACT

First and second networks each comprised of two low-on-impedance transistors having their conduction paths connected in series are connected between first and second circuit outputs and a power terminal. In response to a signal transition of one polarity the two transistors of one network are momentarily turned-on to clamp its associated output to the power terminal. In response to a signal transition of opposite polarity the two transistors of the other network are momentarily turned-on to clamp its associated output to the power terminal.

13 Claims, 3 Drawing Figures

FAST SWITCHING CIRCUIT

This invention relates to switching circuits which are particularly useful in level shift applications.

It is often necessary and/or desirable to operate different parts of an electronic system at different voltage levels. At the places where the different parts interface, they must be coupled to each other. It is, therefore, necessary to provide interface or level shift circuits which can render one part of the system compatible with the other. The interface or level shift circuit should also be compatible with the other circuits of the system with respect to speed of operation and minimization of power dissipation, among other characteristics.

A problem in achieving these goals is best explained with reference to the prior art circuit of FIG. 1 which includes two level shift inverters I1 and I2 driven by an input inverter I11. I11 is operated between a first potential of $V_{CC}$ volts and ground while I1 and I2 are operated between a second potential of $V_{DD}$ volts and ground. I1 and I2, comprised of transistors N1, P1, and N2, P2, are driven by complementary signals IN and $\overline{IN}$, where IN is applied to the input of I11 and $\overline{IN}$ is its output. The sources of transistors N1 and N2 are connected to ground conductor 16. Cross-coupled transistors P1 and P2, which function as the load devices of the level shift inverters, have their conduction paths connected between a conductor 18 to which is applied $V_{DD}$ volts and the drains of transistors N1 and N2, respectively. The drains of transistors P1 and N1 and the gate of P2 are connected to output node 3 at which is produced output $\overline{Q}$, and the drains of transistors P2 and N2 and the gate of P1 are connected to output node 5 at which is produced output Q.

The potential $V_{DD}$ may be, typically, in the range of 5 to 15 volts and $V_{CC}$ may be, typically, in the range of 1.5 to 5 volts. In response to input signals IN and $\overline{IN}$, which vary between $V_{CC}$ volts and ground, output signals are produced at Q and $\overline{Q}$ which vary between $V_{DD}$ and ground.

Assume that IN, which was initially at $V_{CC}$ volts, goes low (i.e. from $V_{CC}$ volts to ground). This causes N1 to be turned-on, and N2 to be turned-off. However, the $\overline{Q}$ and Q outputs which were at $V_{DD}$ and ground, respectively, do not go immediately to ground and $V_{DD}$, respectively. When N1 turns-on, P1 is still turned-on and conducting. To guarantee switching of the level shift inverters, the ON-impedance of each P-type transistor is made much greater than the ON-impedance of the associated N type transistor for the same bias conditions. This ensures that when transistor N1 (N2) turns-on, $\overline{Q}$ (Q) drops significantly below $V_{DD}/2$. However, the high-ON-impedance of the P type transistors slow the rise time of $\overline{Q}$ and Q, resulting in at least two significant problems.

When $\overline{Q}$ goes low it turns-on P2. Current then flows through the conduction path of P2, charging the capacitance associated with output node 5 and causing the Q output to rise towards $V_{DD}$. However, since P2 is a high impedance device it takes a relatively long time to charge up the capacitance at node 5. Until node 5 is charged up to approximatel $V_{DD}$, P1 is on. Consequently, P1 is on during the transition period, during which time N1 is also turned-on. Hence, during the transition period, current flows through P1 and is conducted via turned-on transistor N1 to ground, resulting in undesired power dissipation.

Also due to the high-ON-impedance of the P transistors the rise and fall times of the output signals are unequal. The propagation delays from input to output are unequal for high-to-low and low-to-high transitions. In a typical case, one edge of the level shifted signal, say the rising edge, will have a relatively slow rise time and long propagation delay. However, the falling edge will have a relatively fast fall time and correspondingly short propagation delay. Such unsymmetrical circuit response introduces signal overlap between concurrent logic signals which changes their timing relationship. Timing changes between logic signals, particularly in the case of control signals or clock signals, has an adverse effect on system operation.

Thus, while the prior art circuit has many desirable features, it is relatively slow, dissipates a relatively large amount of power while switching from one state to another, and the rise and fall times are not symmetrical.

An effective solution to the problem is disclosed in my copending application U.S. Ser. No. 359,434, and now U.S. Pat. No. 4,450,371, entitled SPEED UP CIRCUIT and also assigned to the assignee of this application. However, it is desirable in some applications to have a higher speed of response and to use fewer components than in the circuits disclosed in that application.

Circuits embodying the invention include means for increasing the speed of response of a circuit in which first and second switching transistors, driven by complementary input signals, have their conduction paths connected between first and second outputs, respectively, and a first power terminal, and in which relatively high impedance loads are connected between the outputs and a second power terminal. The speed up means includes first and second networks connected between the first and second outputs, respectively, and the second power terminal. Each network includes first and second low-on-impedance transistors having their conduction paths connected in series between their respective output and the second power terminal. Means responsive to the voltages at the first and second outputs are coupled to the control electrodes of the transistors in the two networks for controlling the sequence in which they are turned on and off and permitting the two transistors in a network to be turned-on simultaneously only long enough to clamp the output of that network to the second power terminal.

Figure 2:
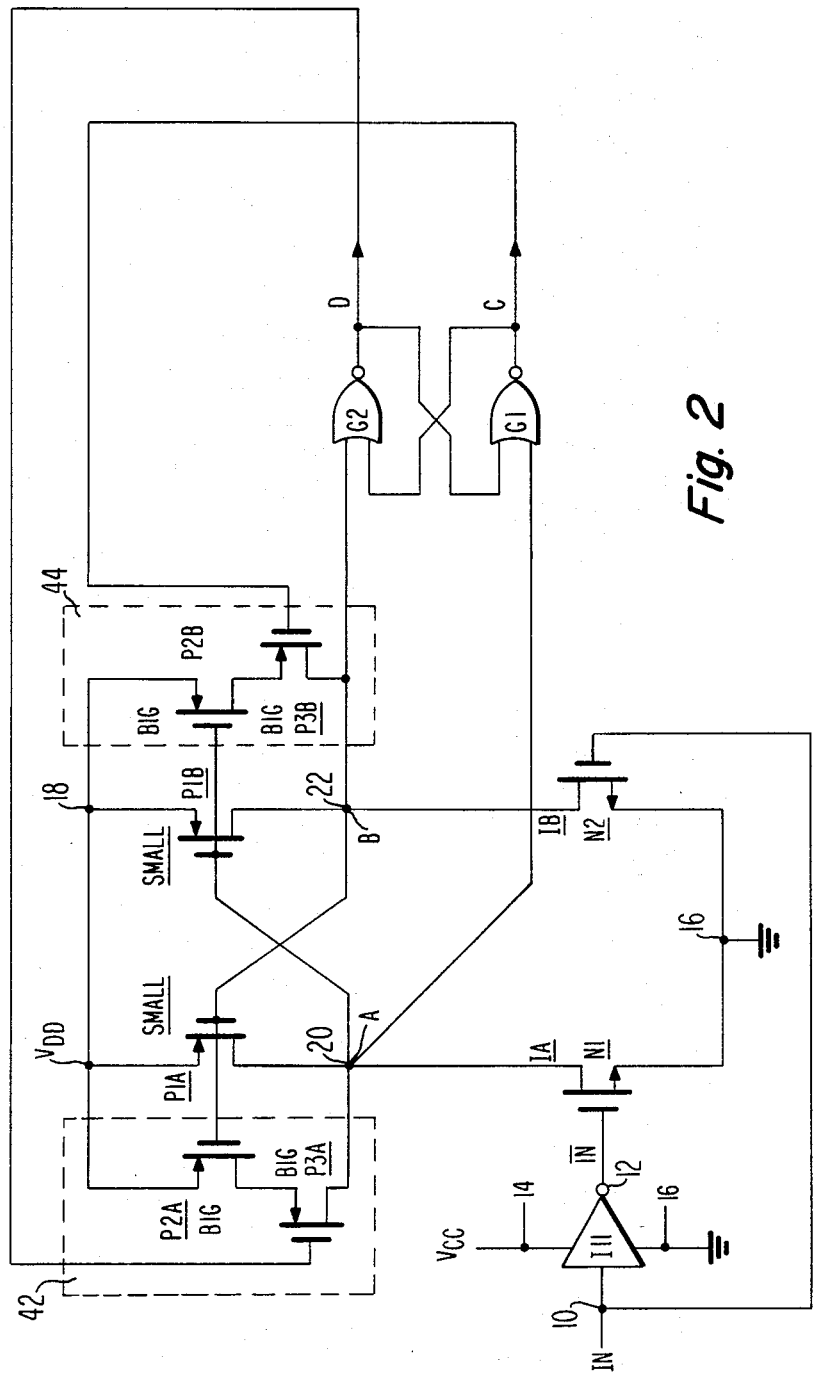
Figure 3:
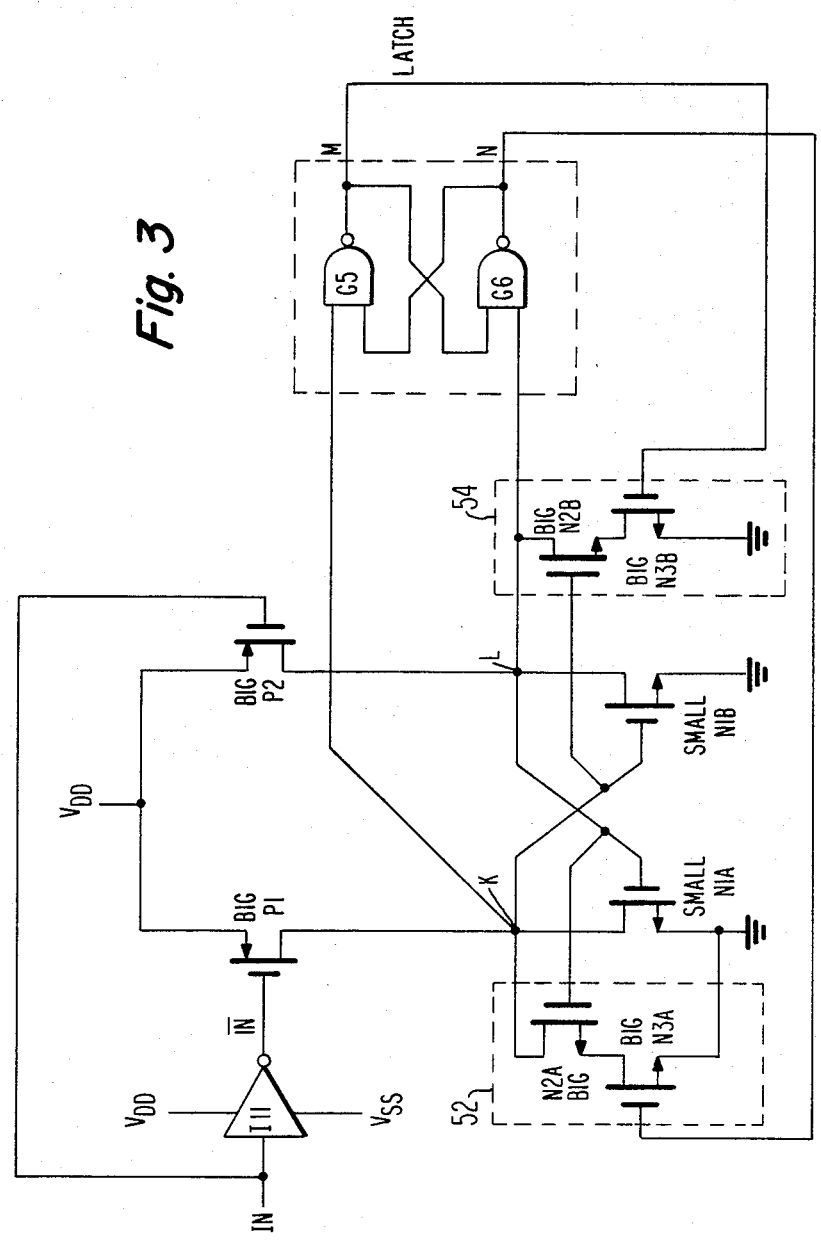

In the accompanying drawing like reference characters denote like components, and FIG. 1 is a schematic diagram of a prior art level shift circuit; and FIGS. 2 and 3 are schematic diagrams of circuits embodying the invention.

In the appended drawing transistors of P-conductivity type are identified by the letter P followed by a reference numeral, and transistors of N-conductivity type are identified by the letter N followed by a reference numeral.

FIG. 2 illustrates an embodiment of the invention which includes an input inverter I11 having an input terminal 10 to which is applied an input signal (IN), an output terminal 12 at which is produced a complementary signal $\overline{IN}$, and power terminals 14 and 16 to which are applied $V_{CC}$ volts and ground, respectively. Inverter I11 may be a complementary inverter comprised of an N-type transistor and a P-type transistor or it may be any one of a number of well known devices capable of inverting signals.

Two cross-coupled inverter means, IA and IB, driven by signals $\overline{\text{IN}}$ and IN, respectively, produce level shifted output signals A and B at outputs 20 and 22, respectively, which vary between ground and $V_{DD}$ volts. Inverting means IA includes switching transistor N1 and a load comprised of transistors P1A, P2A and P3A. The conduction path of P1A, which is a small, high impedance, device is connected between $V_{DD}$ and node 20. The conduction paths of P2A and P3A, which are large, low-ON-impedance devices, are connected in series between $V_{DD}$ and node 20. When P2A and P3A are turned-on they provide a low impedance conduction path between $V_{DD}$ and node 20. The gate electrodes of P1A and P2A are connected to node 22 (output B) whereby P1A and P2A are turned-on and off concurrently. Inverting means IB includes switching transistor N2 and a load comprised of transistors P1B, P2B and P3B. The conduction path of P1B, which like P1A, is a small, high impedance device, is connected between nodes 18 and 22 and the conduction paths of P2B and P3B, which are large, low-ON-impedance devices, are connected in series between nodes 18 and 22. When P2B and P3B are turned-on, they provide a low impedance conduction path between $V_{DD}$ and node 22. The gate electrodes of P1B and p2B are connected to node 20 (output A) whereby P1B and P2B are turned on and off concurrently. The gate electrode of N1 is connected to terminal 12. The gate electrode of N2 is connected to terminal 10. The drain of N1 is connected to output node 20 at which is produced output signal A. The drain of N2 is connected to output node 22 at which is produced output signal B. The source electrodes of N1 and N2 are connected to terminal 16 which is grounded.

P2A, P3A and P2B, P3B are much larger devices than P1A and P1B. In a particular example the ON-impedance of P1A and P1B was made 30 times the ON-impedance of the other load transistors and 100 times the ON-impedance of N1 or N2. It should be appreciated that the ratios of impedances can be varied greatly without departing from the teachings of the invention. However, in all instances, for like values of forward bias, the ON-impedances of P2A, P3A and P2B, P3B are much lower than the ON-impedances of P1A and P1B. As discussed below, the conduction path 42 defined by the series conduction paths of P2A and P3A and the conduction path 44 defined by the series conduction paths of P2B and P3B are only ON momentarily (i.e. they are normally off). Also, the presence of P2A, P3A and P2B, P3B enable the ON-impedances of P1A and P1B to be made very high (i.e., P1 and P2 are very small devices).

The turn-on and turn-off of P3A and P3B is controlled by means of cross-coupled two-input NOR gates G1 and G2. Node 20 is connected to one input of gate G1 and node 22 is connected to one input of gate G2. The output (C) of G1 is connected to the other input of G2 and to the gate electrode of P3B. The output (D) of G2 is connected to the other input of G1 and to the gate electrode of P3A. NOR gates G1 and G2 are cross-coupled to form a bistable flip-flop which functions as a memory means to store the past logic state of the input signal (IN). The operating voltages (not shown) applied to elements G1 and G2 are $V_{DD}$ and ground whereby their outputs swing between these two voltages.

In the discussion of the operation of the circuit to follow, it is assumed that $V_{CC}$ is less than $V_{DD}$, and that signals IN and $\overline{\text{IN}}$ are switched between ground and $V_{CC}$.

The status of the circuit for the two possible steady state conditions of IN=low and IN=High will first be discussed, and it will be shown that for either steady state condition there is no conduction in branches 42 and 44. That is, one of the two transistors in each one of branch 42 and 44 is always turned off during a steady state condition. Assume, initially, that IN is high ($V_{CC}$ volts) and, consequently, that $\overline{\text{IN}}$ is low (ground). $\overline{\text{IN}}$-low causes N1 to be turned-off. IN-high causes N2 to be turned-on and the B output to be at, or close to, ground potential (i.e. is low) which keeps P1A turned-on. Since N1 is turned-off, P1A although a high-impedance device maintains node 20 at, or close to, the $V_{DD}$ volts applied to conductor 18, whereby A is high or $V_{DD}$ volts. A-high, applied to the gates of P1B and P2B keeps them turned-off. A-high applied to G1 causes its output, C, to be low. Concurrently, since B and C are low the output D of G2 is high.

When C is low, it turns-on P3B to whose gate electrode it is applied. However, A-high keeps P2B turned-off. Thus, there is no conduction between nodes 18 and 22 via the series conduction paths of P2B and P3B since P2B is OFF. Concurrently, B-low is applied to the gate electrodes of P1A and P2A turning them both ON while D which is high is applied to the gate electrode of P3A turning-it-OFF. Since P3A is turned-off there is no conduction via the series connected conduction paths of P2A and P3A between nodes 18 and 20. Hence, when IN is high as summarized in line I of Table 1 below, there is no conduction between $V_{DD}$ and nodes 20 or 22 via branches 42 or 44.

When IN is low and $\overline{\text{IN}}$ is high, N1 is switched-on clamping point 20 to ground [A is low] and N2 is turned-off. P1B is turned-on clamping output point 22 to $V_{DD}$ volts [B is high], and P1A and P2A are turned-off. Hence, when IN is low, A is low and B is high. For the condition of A low and B high the output D of G2 is low and the output C of G1 is high. D-low applied to the gate electrode of P3A turns-it-on while B-high applied to the gate electrodes of P1A and P2A turns-them-off. C-high applied to the gate electrode of P3B turns-it-off while A-low applied to the gate electrodes of P1A and P2A turns-them-on. Since P2A is off and since P3B is off there is no conduction via their conduction paths between conductor 18 and nodes 20 or 22. The circuit conditions when IN is low are summarized in line II of Table 1 below.

TABLE 1

|  | IN | A | B | C | D | P1A | P2A | P3A | P1B | P2B | P3B |
|---|---|---|---|---|---|---|---|---|---|---|---|
| I. | HI | HI | LO | LO | HI | ON | ON | OFF | OFF | OFF | ON |
| II. | LO | LO | HI | HI | LO | OFF | OFF | ON | ON | ON | OFF |

The response of the circuit to transient conditions, when the input signal changes levels, will now be discussed. Assume that the input signal IN makes a transition from the low level (ground) condition to the high level ($V_{CC}$) condition causing $\overline{\text{IN}}$ to go from the high level ($V_{CC}$) condition to the low level (ground) condition. The circuit thus goes from the condition described in line II of Table 1 to that described in line I.

As the IN signal rises from ground towards $V_{CC}$ volts, it reaches a value equal to the threshold voltage ($V_T$) of N2. N2 then turns-on. Since only P1B (which is a high-on-impedance device) is ON, N2 which is a low-on-impedance device sinks the current flowing into node 22 to ground and causes the B output to go from $V_{DD}$ volts towards zero volts very quickly. The high-to-low transition at node 22 occurs rapidly [within one gate delay ($\tau_D$)] causing P1A and P2A to turn-on.

P1A is a small (i.e. high impedance) device and has no significant immediate effect on the voltage at node 20. However, when P2A is turned-on a low impedance conduction path is formed between $V_{DD}$ and node 20, since P3A is already ON due to D being low, enabling node 20 (A) to quickly charge up to $V_{DD}$ volts. The signal A at node 20 can rise quickly since concurrently with IN going high, $\overline{\text{IN}}$ going low is applied to N1, cutting it off. As soon as A goes high, it turns-off P1B and P2B and, concurrently, causes the output C of G1 to go low. As soon as C goes low, P3B is turned-on. Concurrently, the two inputs to G2 are now low (since B is already low) and D goes high turning off transistor P3A. This interrupts conduction along path 42 although P2A remains turned-on. Thus, although P2A and P3A were both turned-on for only a very brief period, the period lasts long enough to enable node 20 to be charged up to $V_{DD}$. Then, as soon as node 20 is charged up to $V_{DD}$, the high condition at node 20 is sensed by means of G1 and G2 and a signal (D-high) is fed back to the gate electrode of P3A turning-it-off and preventing further conduction via path 42. Only the high impedance transistor P1A remains actively connected in circuit between node 20 and conductor 18. Since there is no conduction via path 42, when IN goes from high to low on the next transition of the input signal, N1, when 6 turned-on, can pull node 20 to ground quickly and with very little power dissipation.

Analysis of the sequence in which the load transistors in networks 42 and 44 are turned on and off indicates that the sequence is initiated in response to a fast transition at one output (e.g. when B went from high to low). When B went low, the first transistor (P2A) in network 42 was turned on. Since the second transistor (P3A) in network 42 was already ON, node 20 (A) was quickly charged to $V_{DD}$ volts via the low-on-impedance paths of P2A and P3A in network 42. When A first went high the first transistor (P2B) in network 44 was turned-off. The second transistor (P3B) in network 44 was already off. Hence no conduction can occur via network 44 and node 22 is low and stays low. After A went high the output of the bistable latch was switched such that C went from high-to-low and D from low-to-high. C-low turned-on P3B, but since P2B was already off, there is still no low impedance path between conductor 18 and node 22. Concurrently, D-high turned-off P3A and this effectively removed the low impedance connection between conductor 18 and node 20. Thus the two transistors (e.g. P2A, P3A) in the network (e.g. 42) used to clamp an output to $V_{DD}$ are ON simultaneously for as long as it takes to clamp the output to the desired level. As soon as the output is clamped the second transistor (P3A) is turned-off while the first transistor (P2A) is turned-on. The two transistors (e.g. P2B, P3B) in the non-clamping network (e.g. 44) are both OFF until the end of the transition. At the end of the transition the second transistor (e.g. P3B) is turned-on in anticipation of the next transition which will turn on the first transistor of that network.

The circuit behaves in a similar, but complementary, manner when the input signal (IN) makes a negative going (high-to-low) transition. As IN goes low, $\overline{\text{IN}}$ goes high, and N2 is turned-off while N1 is turned-on. As soon as N1 turns-on it quickly causes A to go from $V_{DD}$ (high) to ground (low) since P1A is a high impedance and since D-high holds P3A off barring conduction through P2A. The high-to-low transition of output A turns-on P1B and P2B. Since P3B is already turned-on, due to C being low, as soon as P2B is turned-on conduction via the low impedance path of P2B and P3B causes B to rise quickly towards $V_{DD}$ volts. As soon as B goes high, the output D of G2 goes low and the two inputs to G1 are now low causing C to go high. As soon as C goes high transistor P3B is turned off interrupting conduction between conductor 18 and node 22 via P2B and P3B. Concurrently, B-high turns off P1A and P2A while it causes D to go low which in turn turns-on P3A. The circuit is therefore ready to respond quickly to the next (low to high) transition of the input signal IN.

Thus, after each input signal transition one of the two low impedance conduction paths is momentarily enabled to cause a current surge to quickly charge up a node to the desired potential. Furthermore, as soon as that node is charged up to the desired potential, conduction, via the momentarily enabled path, is interrupted and the other low impedance path is readied for the next, complementary, transition. Readying the complementary branches for the next transition enables the circuit to respond very quickly.

The various conditions of the load transistor switches are summarized below for the condition where: I - IN is high; II - IN goes from high-to-low; III - IN is low; IV - IN goes from low-to-high; and V - IN is high.

I—For steady state condition of A=high and B=low: P2A is ON; P2B is OFF; P3A is OFF; P3B is ON;

II—During the transition following A going from high-to-low: P2A goes from ON to OFF; P2B goes from OFF to ON; P3A remains OFF; P3B remains ON;

III—Following the clamping of node B to $V_{DD}$ and establishing steady state condition of A=low and B=high: P2A is OFF; P2B is ON; P3A is turned ON; P3B is OFF;

IV—During the transition following A going from low-to-high: P2A goes from OFF to ON; P2B goes from ON to OFF; P3A remains ON; P3B remains OFF;

V—Following clamping of node A to $V_{DD}$ volts the circuit returns to condition I above.

The circuit of FIG. 3 is a complementary version of the circuit of FIG. 2. Here the driving or switching transistors (P1, P2) are of P conductivity type and the cross-coupled load transistors (N1A, N1B) are of N conductivity type. Typically the ON-impedance of N1A or N1B is 100 times that of P1 or P2. In the circuit of FIG. 3 the driving transistors (P1 or P2) can quickly charge an output node (K or L) to $V_{DD}$. However, the "small" load transistors (N1A or N1B) cannot quickly discharge the output nodes to ground.

The quick discharge of the output nodes to ground is enabled, and hence the speed of response of the circuit is increased, by the addition of two networks 52 and 54 connected in parallel with transistors N1A and N1B, respectively. Each network includes two low-on impedance transistors N2A, N3A, and N2B, N3B having their conduction paths connected in series between their respective outputs (K,L) and ground. Typically, the ON-impedance of N1A or N1B is 30 times that of the other load transistors. N2A and N2B are cross-coupled and their turn-on and turn-off is controlled in the same manner as N1A and N1B. N3A and N3B are controlled by circuitry which includes a bistable latch comprised of two-cross-coupled two-input NAND gates (G5 and G6) whose outputs M and N are connected to the gate electrodes of N3B and N3A, respectively. The level shift output K is applied to one input of gate G5 and output L is applied to one input of G6. The output (M) of G5 is connected to the other input of G6 and the output (N) of G6 is applied to the other input of G5.

During either steady state condition, only one of the two transistors in each one of paths 52 and 54 is turned on. Following an input signal transition either N2A and N3A or N2B and N3B are concurrently turned-on quickly discharging its associated output node (K or L) to ground.

Assume that, initially, IN is low and that, consequently, K is Low, L is High, M is High, and N is Low. As a result N1B and N2B are OFF and N3B is ON while N1A and N2A are ON and N3A is OFF. Assume now that the input signal (IN) makes a transition from low-to-high and $\overline{IN}$ goes from high-to-low. P1 is switched ON and K goes from low-to-high quickly since only the small N1A is ON to load down the drain of P1. When K goes high N1B and N2B are turned-on. Since N3B is ON due to M being high, N3B and N2B function to discharge node L to ground very quickly via their low impedance paths. After L goes low, N1A and N2A are turned-off and the output N goes high turning on N3A. [Since N2A s already off there is no low impedance path between K and ground]. Since N and K are now high, M is driven low. As soon as M goes low N3B is turned-off. Thus, the use of the parallel paths comprised of N2A and N3A or N2B and N3B enable the speed of response of the circuit to be increased, and the K and L signal outputs to be much more symmetrical with relatively sharp rising and falling edges. This enables the repetition rate of the circuit to be fast.

The operation of the circuit in response to an input signal transition going from high-to-low is the complement of that just described. When IN goes from high-to-low, P2 is turned-on and L goes from low to high quickly since only small device N1B is on between node L and ground. As soon as L goes high N1A and N2A are turned-on. Since N3A is already ON, K is quickly discharged to ground via the conduction paths of N2A, N3A. As soon as the transition from high-to-low at the output (e.g. K) is completed, or nearly completed, M is driven from low-to-high and N is driven from high-to-low. This turns off N3A (since node K is low it no longer needs to be discharged) and turns-on N3B. The turn-on of N3B enables path 54 to quickly discharge node L on the next transition of IN from low-to-high. The use of the Low-on impedance paths in parallel with the high impedance load devices N1A, N1B enable the input signal to have a much higher repetition rate. That is, the circuit can respond quickly since its nodes are quickly driven to steady state conditions.

It should be appreciated that the latch circuitry (G1, G2 in FIG. 2 OR G5, G6 in FIG. 3) could be replaced by other suitable pulse forming networks including means for storing the previous steady steady condition and which is responsive to a well defined signal to turn-on a low-on-impedance path.

What is claimed is:

1. In a circuit in which first and second switching transistors driven by complementary input signals, have their conduction paths connected between first and second outputs, respectively, and a first power terminal, and in which relatively high impedance loads are connected between the outputs and a second power terminal, whereby the signals at said outputs tend to be unsymmetrical going from a second level, approximately equal to the voltage at said second power terminal, to a first level, approximately equal to the voltage at said first power terminal, much faster than from said first level to said second level, means for rendering the signal at said first and second outputs more symmetrical, comprising:

first, second, third and fourth load transistors, each load transistor having a conduction path and a control electrode, and the load transistors when turned-on exhibiting a relatively low impedance along their conduction paths;

means connecting the conduction paths of said first and second load transistors in series between said first output and said second power terminal;

means connecting the conduction paths of said third and fourth load transistors in series between said second output and said second power terminal;

means connecting the control electrode of said first load transistor to said second output and the control electrode of said third load transistor to said first output; and bistable means coupled between said first and second outputs and the control electrodes of said second and fourth load transistors responsive to the signal at said first output being at said first level for turning-off said fourth load transistor and turning-on said second load transistor and responsive to the signal at said second output being at said first level for turning-off said second load transistor and turning-on said fourth load transistor.

2. The circuit as claimed in claim 1 wherein said transistors are insulated-gate field-effect transistors 3. The circuit as claimed in claim 1 wherein said bistable means includes two cross coupled logic gates.

4. The circuit as claimed in claim 3 wherein said load transistors are of one conductivity type and said first and second switching transistors are of opposite conductivity type.

5. The circuit as claimed in claim 4 wherein said relatively high impedance load means are transistors of said one conductivity type.

6. In a circuit in which first and second switching transistors driven by complementary input signals have their conduction paths connected between first and second outputs, respectively, and a first power terminal, and in which relatively high impedance loads are connected between the outputs and a second power terminal, whereby the signals at said outputs tend to be unsymmetrical going from a second level, approximately equal to the voltage at said second power terminal, to a first level, approximately equal to the voltage at said first power terminal, much faster than from said first level to said second level, means for rendering the signal at said first and second outputs more symmetrical, comprising:

first, second, third and fourth load transistors, each load transistor having a conduction path and a control electrode, and the load transistors when turned-on exhibiting a relatively low impedance along their conduction paths;

means connecting the conduction paths of said first and second load transistors in series between said first output and said second power terminal;

means connecting the conduction paths of said third and fourth load transistors in series between said second output and said second power terminal;

means connected between said first and second outputs and the control electrodes of said first and third transistors for turning-on said first transistor when said second output is at said first level and turning-off said second transistor when said first output is at said second level and for turning-on said third transistor when said first output is at said first level and turning-off said first transistor when said second output is at said second level; and bistable storage means connected between said first and said second outputs and the control electrodes of said third and fourth transistors responsive to the signal at said first output going from a first level to a second level for turning-off said second transistor and turning on said fourth transistor and responsive to the signal at said second output going from said first level to said second level for turning-off said fourth transistor and turning-on said second transistor.

7. The combination comprising:

first and second power terminals for the application thereto of first and second operating potentials, respectively;

first and second input terminals for the application thereto of complementary input signals;

first and second outputs at which are produced output signals in response to said input signals;

first and second switching transistors, each having a conduction path and a control electrode;

means connecting the conduction paths of said first and second transistors between said first and second outputs, respectively, and said first power terminal;

means connecting the control electrodes of said first and second transistors to said first and second input terminals, respectively;

third, fourth, fifth, sixth, seventh and eighth transistors each having a conduction path and a control electrode; said third and fourth transistors, when turned-on, having a much higher impedance than the ON-impedance of said first, second, fifth, sixth, seventh and eighth transistors;

means connecting the conduction path of said third transistor between said first output and said second power terminal, and the conduction paths of said fifth and sixth transistors in series between said first output and said second power terminal;

means connecting the conduction path of said fourth transistor between said second output and said second power terminal and the conduction paths of said seventh and eighth transistors in series between said second output and said second power terminal;

means connecting the control electrodes of said third and fifth transistors to said second output and the control electrodes of said fourth and seventh transistors to said first output;

a set-reset flip-flop having set and reset inputs, and first and second bistable outputs;

means connecting said set input to said first output, said reset input to said second output; and means connecting said first bistable output to the control electrode of said sixth transistor and said second bistable output to the control electrode of said eighth transistor.

8. The combination as claimed in claim 7 wherein said transistors are insulated-gate field-effect transistors (IGFETs).

9. The combination as claimed in claim 8 when said first and second transistors are of one conductivity type and said third, fourth, fifth, sixth, seventh and eighth transistors are of opposite conductivity type.

10. The combination as claimed in claim 7 wherein said set, reset flip-flop includes first and second cross-coupled NOR gates; wherein said first output is connected to one input of said first NOR gate and wherein said second output is connected to one input of said second NOR gate; and wherein the output of said first NOR gate is connected to the control electrode of said eighth transistor; and wherein the output of said second NOR gate is connected to the control electrode of said sixth transistor.

11. In a circuit in which first and second switching transistors driven by complementary input signals, have their conduction paths connected between first and second outputs, respectively, and a first power terminal, and in which relatively high impedance loads are connected between the outputs and a second power terminal, whereby the signals at said outputs tend to be unsymmetrical going from a second level, approximately equal to the voltage at said second power terminal, to a first level, approximately equal to the voltage at said first power terminal, much faster than from said first level to said second level, means for rendering the signal at said first and second outputs more symmetrical, comprising:

first, second, third and fourth load transistors, each load transistor having a conduction path and a control electrode, and the load transistors when turned-on exhibiting a relatively low impedance along their conduction paths;

means connecting the conduction paths of said first and second load transistors in series between said first output and said second power terminal;

means connecting the conduction paths of said third and fourth load transistors in series between said second output and said second power terminal;

means connecting the control electrode of said first load transistor to said second output for turning-it-on when said second output is at a first level and turning-it-off when said second output is at a second level, and means connecting the control electrode of said third load transistor to said first output for turning-it-on when said first output is at a first level and turning-it-off when said first output is at said second level; and means coupled between said first and second outputs and the control electrodes of said second and fourth transistors responsive to the signal at said first output making a transition from said second level to said first level for clamping said second output to said second power terminal via the low-on impedance of said third and fourth transistors and responsive to the second output being clamped to said second power terminal for then turning-on said second transistor.

12. In a circuit in which first and second switching transistors driven by complementary input signals, have their conduction paths connected between first and second outputs, respectively, and a first power terminal, and in which relatively high impedance loads are connected between the outputs and a second power terminal, whereby the signals at said outputs tend to be unsymmetrical going from a second level, approximately equal to the voltage at said second power terminal, to a first level, approximately equal to the voltage at said first power terminal, much faster than from said first level to said second level, means for rendering the signal at said first and second outputs more symmetrical, comprising:

first, second, third and fourth load transistors, each load transistor having a conduction path and a control electrode, and the load transistors when turned-on exhibiting a relatively low impedance along their conduction paths;

means connecting the conduction paths of said first and second load transistors in series between said first output and said second power terminal;

means connecting the conduction paths of said third and fourth load transistors in series between said second output and said second power terminal;

means connecting the control electrode of said first load transistor to said second output and the control electrode of said third load transistor to said first output; and bistable means responsive to the voltages at said first and second outputs coupled to the control electrodes of said second and fourth load transistors for driving said second and fourth load transistors to complementary states.

13. In the circuit as claimed in claim 12 wherein said bistable means also drives said second transistor to a complementary state to that of said first transistor and said fourth transistor to a complementary state to that of said third transistor.

* * * * *

UNITED STATES PATENT AND TRADEMARK OFFICE
CERTIFICATE OF CORRECTION

PATENT NO. : 4,532,436
DATED : July 30, 1985
INVENTOR(S) : Otto H. Eismarck

It is certified that error appears in the above-identified patent and that said Letters Patent is hereby corrected as shown below:

Col. 1, line 63, change "approximatel" to - - - approximately - - -.
Col. 3, line 25, change "p2E" to - - - P2B - - -.
Col. 5, line 36, delete "6".

Signed and Sealed this

Seventeenth Day of December 1985

[SEAL]

Attest:

DONALD J. QUIGG

Attesting Officer

Commissioner of Patents and Trademarks